US011099616B2

(12) United States Patent
Wu

(10) Patent No.: US 11,099,616 B2
(45) Date of Patent: Aug. 24, 2021

(54) HEAT DISSIPATING HOUSING AND PLUGGABLE ELECTRONIC DEVICE HAVING THE SAME

(71) Applicant: GETAC TECHNOLOGY CORPORATION, Hsinchu County (TW)

(72) Inventor: Chi-Jung Wu, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 168 days.

(21) Appl. No.: 15/916,123

(22) Filed: Mar. 8, 2018

(65) Prior Publication Data

US 2019/0121404 A1 Apr. 25, 2019

(30) Foreign Application Priority Data

Oct. 20, 2017 (CN) .......................... 201710982616.7

(51) Int. Cl.
| G06F 1/20 | (2006.01) |
| H05K 5/03 | (2006.01) |
| H05K 7/20 | (2006.01) |
| G11B 33/14 | (2006.01) |
| G06F 1/18 | (2006.01) |

(52) U.S. Cl.
CPC .............. *G06F 1/20* (2013.01); *G06F 1/187* (2013.01); *G06F 1/203* (2013.01); *G11B 33/1426* (2013.01); *H05K 5/03* (2013.01); *H05K 7/2029* (2013.01); *H05K 7/2039* (2013.01); *G06F 2200/201* (2013.01)

(58) Field of Classification Search
CPC .......... G06F 1/20; H05K 5/03; H05K 7/2029; H05K 7/2039
See application file for complete search history.

(56) References Cited

U.S. PATENT DOCUMENTS

| 5,780,928 A * | 7/1998 | Rostoker | H01L 23/427 |
| | | | 257/713 |
| 8,784,125 B2 * | 7/2014 | Hoang | G06K 7/0047 |
| | | | 439/345 |
| 2009/0323276 A1 * | 12/2009 | Mongia | G06F 1/203 |
| | | | 361/679.52 |
| 2011/0273834 A1 * | 11/2011 | Moriai | G06F 1/20 |
| | | | 361/679.32 |
| 2016/0088769 A1 * | 3/2016 | Hsiao | G06F 1/20 |
| | | | 361/700 |

* cited by examiner

*Primary Examiner* — James Wu
*Assistant Examiner* — Hung Q Dang

(57) ABSTRACT

A pluggable electronic device includes a base, a heat source module and an upper cover. The base is made of a metal material. The heat source is disposed at the base. The upper cover covers the heat source module, is connected to the base, and includes an enclosed cavity and an operating fluid cyclically performing evaporation and condensation in the enclosed cavity.

15 Claims, 7 Drawing Sheets

HEAT DISSIPATING HOUSING AND PLUGGABLE ELECTRONIC DEVICE HAVING THE SAME

CROSS REFERENCE TO RELATED APPLICATIONS

This Application claims priority of China Patent Application No. 201710982616.7 filed on Oct. 20, 2017, the entirety of which is incorporated by reference herein.

BACKGROUND OF THE INVENTION

Field of the Invention

The invention relates in general to a heat dissipating housing and a pluggable electronic device having the heat dissipating housing, and more particularly, to a heat dissipating housing with a heat conduction mechanism and a pluggable data storage device having the heat dissipating housing.

Description of the Prior Art

Accompanied with the popularity of electronic information processing, the quality and amounts of electronic information are also ever-increasing. Thus, the importance of access performance of a data storage device in charge of accessing electronic information is becoming more and more valued. With the enhanced performance of a data storage device, heat energy generated from operations of the data storage device is correspondingly increased, drawing even more attention to the significance of a heat dissipation mechanism of a data storage device.

Data storage devices are mainly categorized into hard disk drives (HDDs) and solid-state drives (SDDs). An SDD, having outstanding characteristics including good shock resistance, fast reading and writing and low power consumption, is gradually replacing the conventional HDD. Currently, in a common SDD, a heat dissipation mechanism mainly relies on and coordinates with a system where the SDD is installed for heat dissipation. More specifically, a heat dissipating material is adhered on an SDD installed in a system, and heat energy generated by the SDD is guided through the heat dissipating material to a casing or a motherboard of the system, hence providing a heat dissipating channel for the SDD and preventing malfunctions or degraded performance of the SDD due to accumulated heat. However, with the market availability of high-speed SDDs, waste heat generated by such high-speed SDDs has increased drastically in a way that the conventional mechanism of relying on the system for heat dissipation is no longer adequate. Therefore, there is a need for a solution for a heat dissipation mechanism for use with an SDD.

SUMMARY OF THE INVENTION

The present invention provides a heat dissipating housing and a pluggable electronic device having the heat dissipating housing. It is an object of the present invention to accordingly improve a heat dissipation mechanism of a pluggable electronic device, e.g., a solid-state drive (SDD).

To achieve the above object, the present invention provides a heat dissipating housing and a pluggable electronic device having the heat dissipating housing. The pluggable electronic device includes a base, a heat source module and an upper cover. The base is made of a metal material. The heat source module is disposed at the base. The upper cover covers the heat source module, is connected to the base, and includes an enclosed cavity and an operating fluid cyclically performing evaporation and condensation in the enclosed cavity.

Accordingly, the present invention integrates and modularizes the heat source module and the heat dissipating housing, providing the pluggable electronic device with good heat dissipation performance without relying on a system and preventing accumulated heat and issues derived therefrom of the pluggable electronic device.

DETAILED DESCRIPTION OF THE EMBODIMENTS

Figure 1:
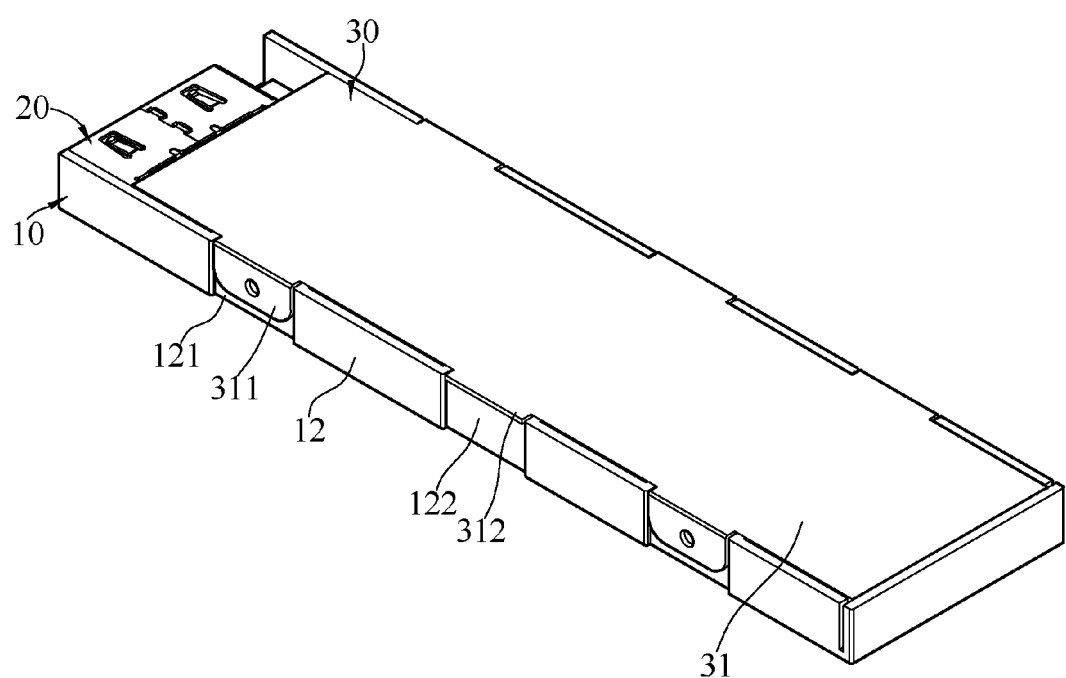
FIG. 1 is a perspective appearance diagram of a heat dissipating housing and a pluggable electronic device having the heat dissipating housing according to an embodiment of the present invention.

FIG. 1 is a perspective appearance diagram of a heat dissipating housing and a pluggable electronic device having the heat dissipating housing according to an embodiment of the present invention. Referring to FIG. 1, the pluggable electronic device includes a base 10, a heat source module 20 and an upper cover 30. In this embodiment, the pluggable electronic device is a pluggable data storage device, and the heat source module 20 is a storage module having a data storage function. However, in other embodiments, the pluggable electronic device may be another mobile device or pluggable device that generates a heat source, and the heat source module 20 may be an electronic component module having a corresponding function. The base 10 is made of a metal material, the heat source module 20 is disposed at the base 10, and the upper cover 30 covers the heat source module 20 and is connected to the base 10, hence in overall forming a pluggable data storage device. In this embodiment, the heat source module 20 includes at least one heat source, the base 10 accommodates and carries the heat source module 20, and the upper cover 30 covers the heat source module 20 and is connected to the base 10, such that the base 10 and the upper cover 30 form a housing of the heat source module 20. However, in other embodiments, the heat source may be a heat emitting component on a circuit board, e.g., an EC, an MCU or a CPU, or a component that carries a high current, e.g., a connector or a bus. In this embodiment, the upper cover 30 is substantially a heat conductive plate, and heat energy generated by the heat source module 20 can be evenly conducted through the upper cover 30 covered thereon to achieve a main heat dissipating effect, whereas the base 10 made of metal can facilitate the heat dissipation and achieve another heat dissipation effect. Further, the form of the upper cover 30 being directly connected to the base 10 provides the overall device with an independent heat dissipation design. Thus, when such form is used independently, a heat dissipation effect is provided without relying on other heat dissipation assemblies for heat dissipation. When considering a position at which a pluggable electronic device is configured on a mainframe, e.g., a laptop computer or a desktop computer, because the heat dissipation of the pluggable electronic device yet relies on the heat dissipating mechanism of the mainframe, e.g., a fan, a heat conductive plate or a mainframe housing, the pluggable electronic device needs to coordinate with the heat dissipation mechanism of the mainframe. However, when the heat dissipating housing of the present invention is integrated with a pluggable electronic device, because the pluggable electronic device on its own has sufficient heat dissipation efficiency, the pluggable electronic device can even disperse the heat generated by the mainframe without relying on the heat dissipation mechanism in the mainframe. Thus, the configuration of the pluggable electronic device relative to the mainframe does not need to take into account or coordinate with the heat dissipation mechanism of the mainframe. As such, when considering the configuration relationship of the mainframe and the pluggable electronic device, the design burden can be alleviated, or the respective and overall heat dissipation efficiency can be enhanced.

In one embodiment, the base 10 is made of a metal material having a good heat conductive property, and may be made of, for example but not limited to, aluminum, copper or a composite material including the above. Accordingly, the base 10 made of a material having a good heat conductive property can provide the overall device with a medium for heat dissipation.

Figure 2:
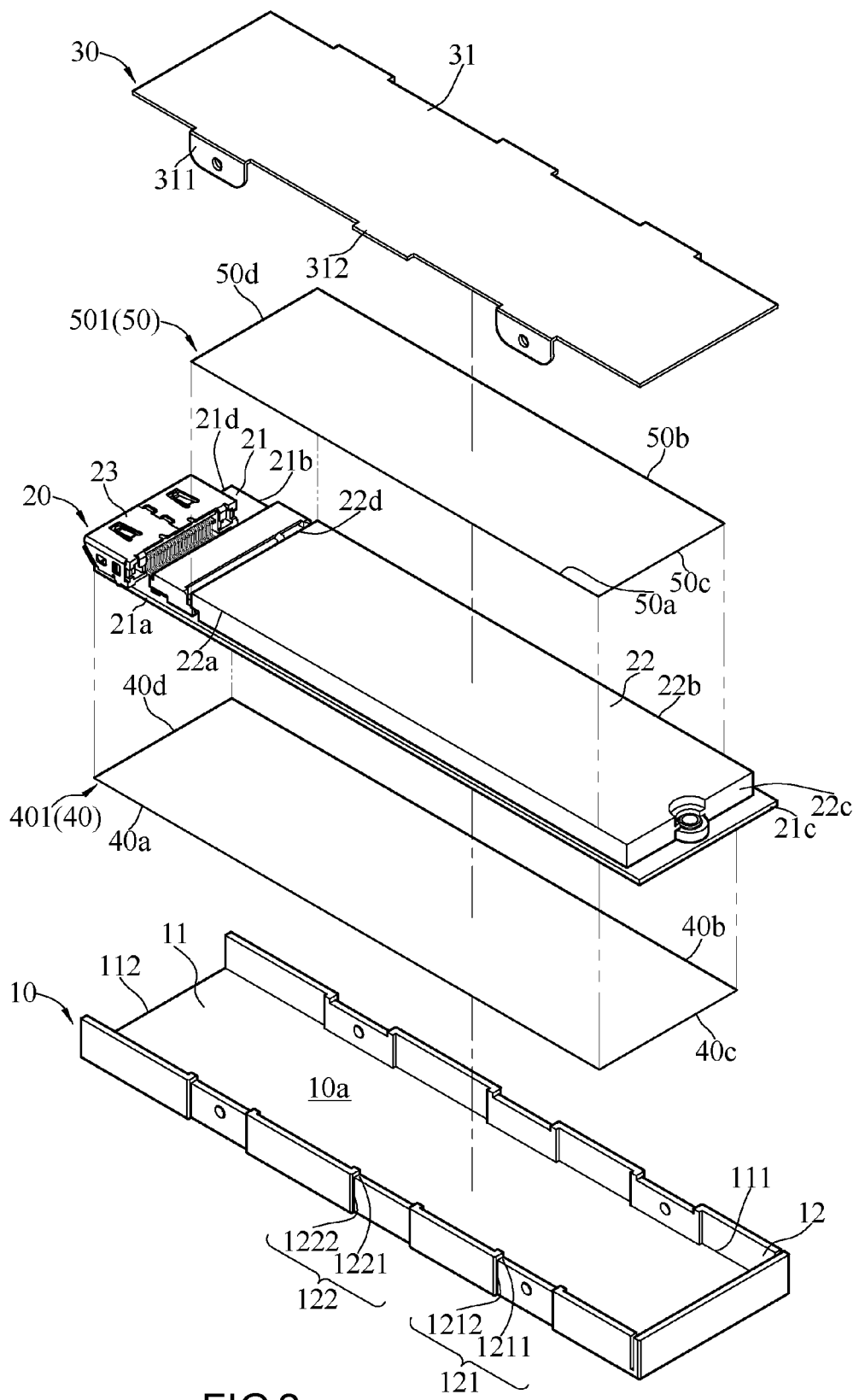
FIG. 2 is an exploded perspective structural diagram of a heat dissipating housing and a pluggable electronic device having the heat dissipating housing according to an embodiment of the present invention.

FIG. 2 shows an exploded perspective structural diagram of a heat dissipating housing and a pluggable electronic device having the heat dissipating housing according to an embodiment of the present invention. Referring to FIG. 2, in this embodiment, the base 10 has an accommodating space 10a for accommodating the heat source module 20. The base 10 includes a lower surface portion 11 and a side surface portion 12, which are non-coplanar, and the side surface portion 12 is located at a periphery of the lower surface portion 11 to define the accommodating space 10a. More specifically, a contour of the periphery of the lower surface portion 11 of this embodiment is approximately rectangular and has two long sides 111 and two short sides 112. The side surface portion 12 is located at the two long sides 111 and one of the short sides 112. Accordingly, the base 10 has an open rectangular accommodating space 10a corresponding to the other of the short sides 112.

Referring to FIG. 2, in one embodiment, the heat source module 20 includes a substrate 21, a memory 22 and a connection port 23. The memory 22 and the connection port 23 are electrically connected to the substrate 21. Except the connection port 23, components of the heat source module 20 are completely packaged between the base 10 and the heat source module 20. Thus, the contour of an outer periphery of the substrate 21 is approximately rectangular and is slightly smaller than that of the lower surface portion 11 of the base 10, so as to be accommodated in the accommodating space 10a of the base 10. The memory 22 and the connection port 23 are respectively located at positions at two ends of the long sides of the substrate 21. When the heat source module 20 is accommodated in the accommodating space 10a of the base 10, the position of the connection port 23 of the heat source module 20 corresponds to the open side of the accommodating space 10a of the base 10, allowing the connection portion 23 to connect to a corresponding connection port. At this point, the substrate 21 of the heat source module 20 is adhered to the lower surface portion 11 of the base 10. As such, when the memory 22 of the heat source module 20 operates and generates heat, the heat energy is transmitted through the substrate 21 to the base 10, and quickly conducted through the base 10 to an exterior to achieve the heat dissipation.

Figure 8:
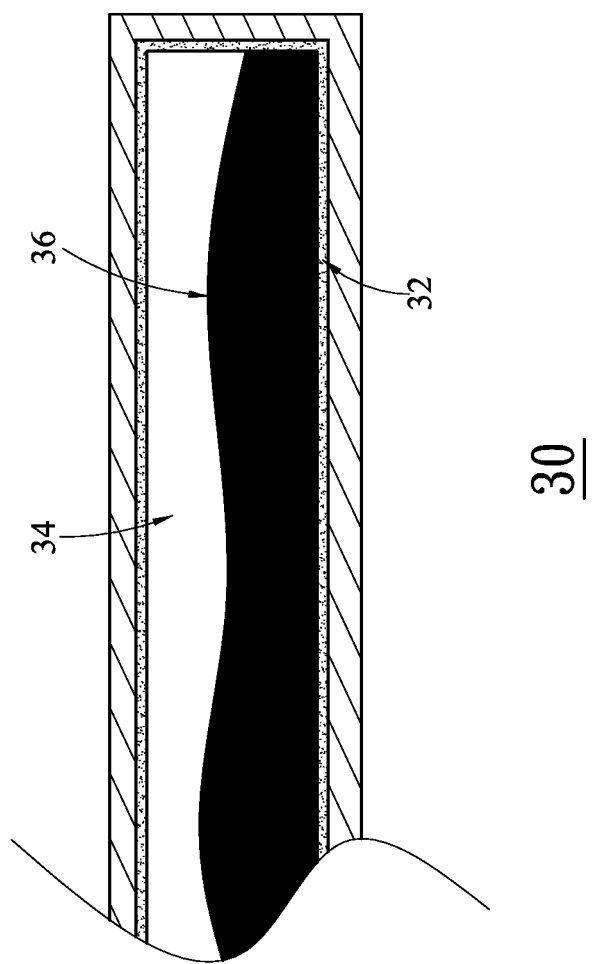
FIG. 8 is a schematic view of an embodiment of an upper cover the application.

Referring to FIG. 1, FIG. 2 and FIG. 8, in one embodiment, the upper cover 30 covers the heat source module 20 and is connected to the base 10. In this embodiment, the upper cover 30 includes an enclosed cavity 34, and an operating fluid 36 performing cyclic evaporation and condensation in the enclosed cavity. The upper cover 30 may be made of a metal material such as aluminum or copper. An inner surface of the enclosed cavity has a capillary structure 32, which may be structured as sintered powder, netlike or an uneven surface (including a burrow form, a column form, a rough surface, or a regular or irregular protruding/recessed form). In this embodiment, the upper cover 30 is made of copper, the capillary structure 32 in the enclosed cavity is a capillary structure 32 in a burrow form, and the operating fluid 36 may be pure water.

Thus, when the heat source module 20 operates and generates heat, the heat energy of the heat source module 20 is transmitted to the upper cover 30. The operating fluid 36 in the upper cover 30 comes into contact with the heat energy and evaporates into vapor that then flows in the enclosed cavity 34. Such effect is an endothermic reaction, under which an evaporation area is formed, and liquid in this evaporation area is evaporated into gas. When the vapor flows to a position in the enclosed cavity 34 with a lower temperature, the vapor is condensed to change its phase and becomes liquid. Such effect is an exothermic reaction, under which a condensation area is formed, and vapor entering the condensation area is condensed into liquid. With the capillary force generated by the capillary structure 32 in the enclosed cavity, the liquid is guided to the evaporation area having a smaller amount of liquid. The operating fluid 36 continuously performs endothermic and exothermic reactions in the enclosed cavity 34 to continually and cyclically move in the evaporation area and the condensation area, allowing the heat energy of the upper cover 30 to be quickly dispersed and producing a heat dissipation effect for the heat source module 20.

Thus, when the heat source module 20 operates and generates heat, the heat energy of the heat source module 20 can be transmitted simultaneously to the upper cover 30 and the base 10, both of which simultaneously absorb the heat energy of the heat source module 20 to achieve a heat dissipation effect. Further, the operation principle of the upper cover 30 causes the heat energy to be evenly dissipated, preventing the heat source module 20 from generating a heat generating issue at a partial area, and further enhancing the operating performance of the heat source module 20.

In addition, because the heat source module 20 is combined with the base 10 and the upper cover 30 into a structure in this embodiment, the overall device on its own, without relying on a system for heat dissipation, offers heat dissipation performance even if such structure is independently externally connected and used outside a system. Thus, application limitations of such structure are decreased to increase added values.

Figure 4:
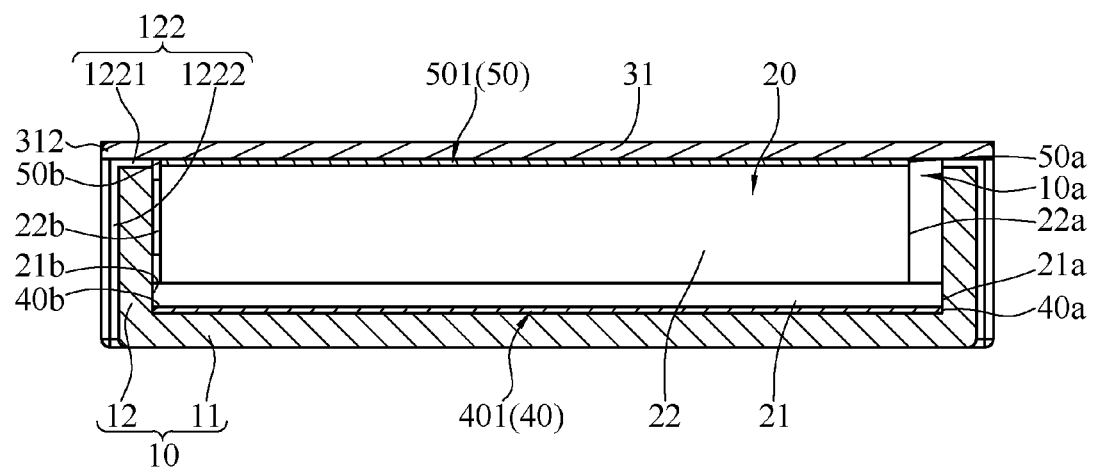
FIG. 4 is a section view of the embodiment in FIG. 2 at a position of a leveled lug portion.

Further referring to FIG. 2 and FIG. 4, in one embodiment, to further enhance the heat conduction effect between the heat source module 20 and the base 10, a first heat dissipating member 40 can be disposed between the base 10 and the heat source module 20. The first heat dissipating member 40 is a thermal interface material, and fills micro gaps between the base 10 and the heat source module 20 that are in contact and holes at the uneven surface, hence mitigating the impedance of heat transmission and enhancing heat dissipation efficiency.

Preferably, the first heat dissipating member 40 is made of a material having high heat conductivity, high flexibility, an insulation property, detachability, and high adaptability. For example, the first heat dissipating member 40 may be an anvil curing heat-conducting adhesive, a phase changing material or a heat conductive elastomer material, and may be in a substantial form of a heat conductive adhesive, a heat conductive sealant, a heat conductive paste or a heat conductive tape.

In one embodiment, the first heat dissipating member 40 is a heat conductive plate 401, which may be a thin plate structure made of a thermal interface material. In this embodiment, the heat conductive plate 401 is, for example but not limited to, a thin rectangular plate structure.

More specifically, in one embodiment, the outer contour of the substrate 21 of the heat source module 20 is rectangular, and has a first long side 21a and the second long side 21b that are opposite to each other, and a first short side 21c and a second short side 21d that are opposite to each other. The first short side 21c and the second short side 21d are respectively connected between two ends of the first long side 21a and the second long side 21b. The heat conductive plate 401 has a first long side 40a and the second long side 40b, and a first short side 40c and a second short side 40d that are opposite to each other. The first short side 40c and the second short side 40d are respectively connected between the two ends of the first long side 40a and the second long side 40b. When the heat conductive plate 401 is adhered between the substrate 21 of the heat source module 20 and the base 10, the first long side 40a of the heat conductive plate 401 overlaps the first long side 21a of the substrate 21, the second long side 40b of the heat conductive plate 401 overlaps the second long side 21b of the substrate 21, the second short side 40d of the heat conductive plate 401 overlaps the second short side 21d of the substrate 21, and the first short side 40c of the heat conductive plate 401 is parallel to the first short side 21c of the substrate 21 by a distance. That is to say, the length of the heat conductive plate 401 is slightly less than the length of the substrate 21, such that a space between the first short side 40c of the heat conductive plate 401 and the first short side 21c of the substrate 21 allows a screw fastening member to pass through the substrate 21 and to be fastened at the base 10.

With the configuration of the heat conductive plate 401 and the substrate 21, the heat conductive plate 401 is allowed to come into contact with the substrate 21 by a maximum area, so as to quickly transmit the heat energy generated on the substrate 21 to the base 10 and conduct the heat energy to an exterior, enhancing heat conduction and heat dissipation effects.

Figure 3:
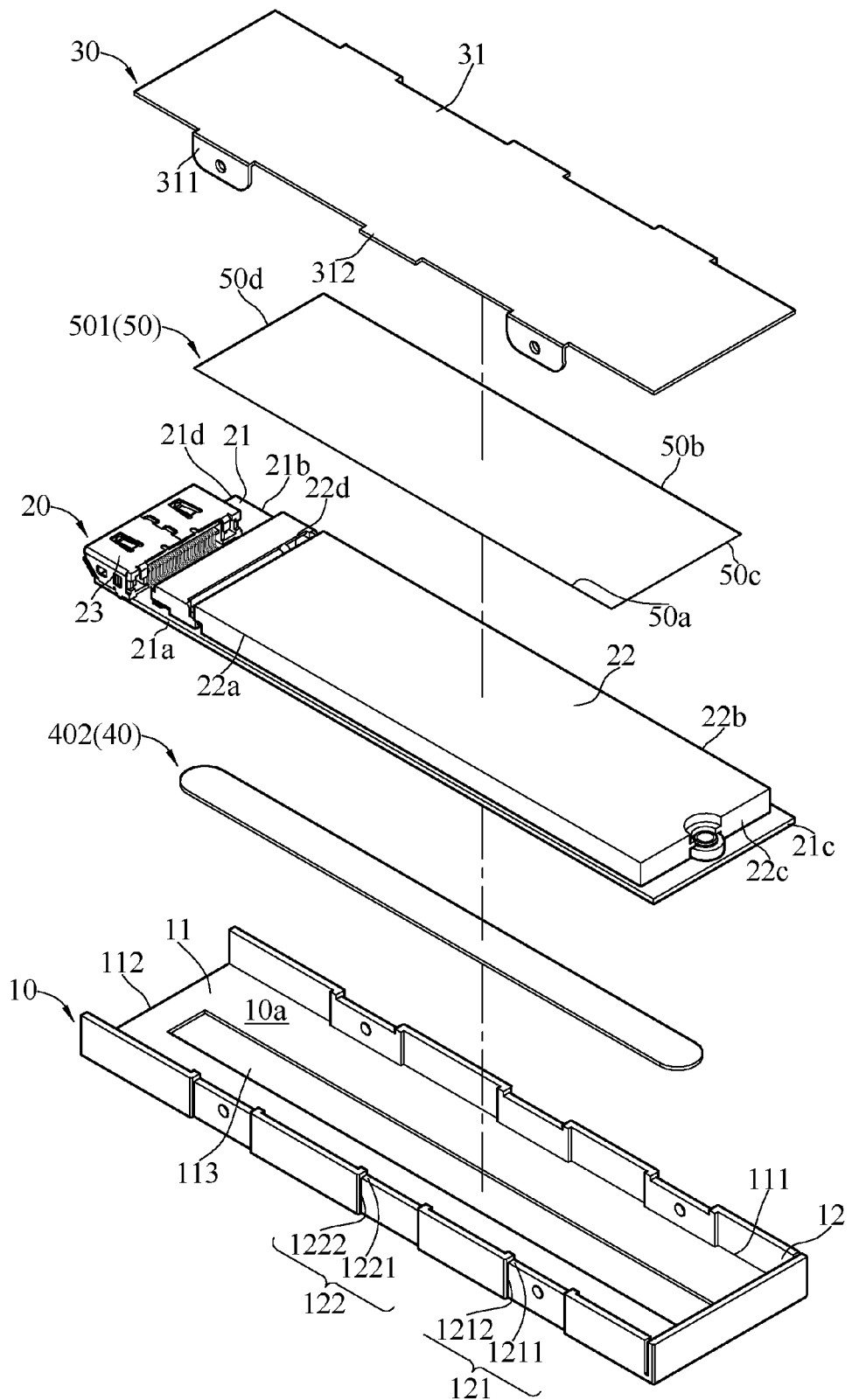
FIG. 3 is an exploded perspective structural diagram of a pluggable electronic device according to another embodiment of the present invention.
Figure 5:
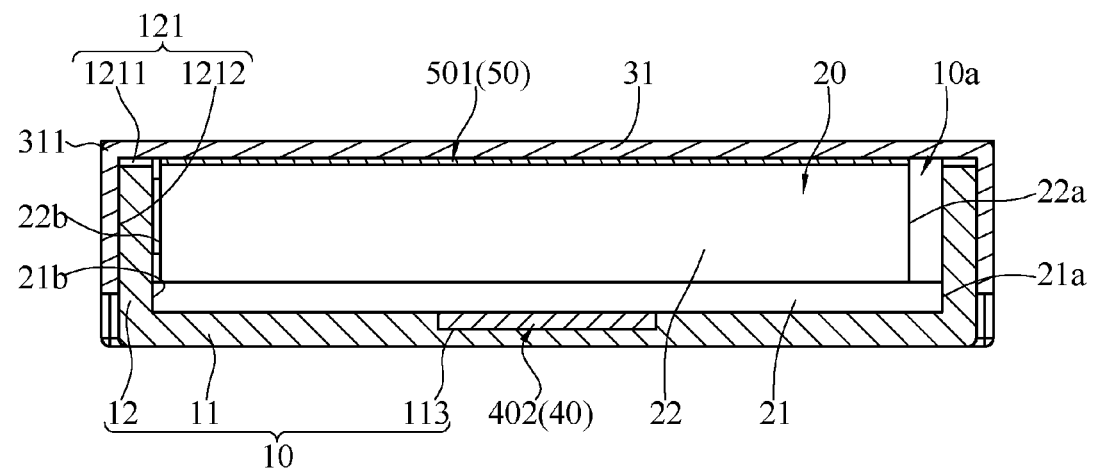
FIG. 5 is a section view of the embodiment in FIG. 3 at a position of a bent lug portion.

Referring to FIG. 3 and FIG. 5, in another embodiment, the form of the heat dissipating member 40 is not limited to the heat conductive plate 401 made of a thermal interface material as disclosed above, and may be a hot tube 402. The hot tube 402 is a heat conduction structure in form of a hollow tube, which is provided with a capillary structure therein and accommodates an operating fluid that can continually and cyclically perform evaporation and condensation in the hollow tube. In this embodiment, because the hot tube 402 needs to include a hollow cavity, the thickness of the hot tube 402 is slightly more than that of the heat conductive plate 401. Thus, in this embodiment, the lower surface portion 11 of the base 10 further includes a channel 113, in which the hot tube 402 is accommodated. When the hot tube 402 is accommodated in the channel 113, the hot tube 402 does not protrude from the lower surface portion 11.

Accordingly, referring to FIG. 5, when the substrate 21 of the heat source module 20 is accommodated in the accommodating space 10a, a part of the substrate 21 is adhered to the lower surface portion 11, whereas the remaining part is adhered to the hot tube 402. That is to say, in this embodiment, the substrate 21 is still in complete contact with the base 10 or the hot tube 402 having a heat conduction effect, and the heat energy generated from operations of the heat source module 20 can be quickly conducted through the base 10 and the hot tube 402 to an exterior, enhancing the heat dissipation effect.

Referring to FIG. 2 or FIG. 3, to further enhance the heat conduction effect between the heat source module 20 and the upper cover 30, a second heat dissipating member 50 can be further provided between the heat source module 20 and the upper cover 30. The second heat dissipating member 50 may be made of a thermal interface material. The second heat dissipating member 50 fills micro gaps between the base 10 and the heat source module 20 that are in contact and holes at the uneven surface, mitigating the impedance of heat transmission and enhancing heat dissipation efficiency.

Preferably, the second heat dissipating member 50 is made of a material having high heat conductivity, high flexibility, an insulation property, detachability, and high adaptability. For example, the second heat dissipating member 50 may be an anvil curing heat-conducting adhesive, a phase changing material or a heat conductive elastomer material, and may be in a substantial form of a heat conductive adhesive, a heat conductive sealant, a heat conductive paste or a heat conductive tape.

In one embodiment, the second heat dissipating member 50 is a heat conductive plate 501, which may be a thin plate structure made of a thermal interface material. In this embodiment, the heat conductive plate 501 is, for example but not limited to, a thin rectangular plate structure.

Similarly referring to FIG. 2 and FIG. 3, more specifically, in one embodiment, an outer contour of the memory 22 of the heat source module 20 is rectangular, and includes a first long side 22a and a second long side 22b that are opposite to each other, and a first short side 22c and a second short side 22d that are opposite to each other. The first short side 22c and the second short side 22d are respectively connected between two ends of the first long side 22a and the second long side 22b. The first long side 22a of the memory 22 is shorter than the first long side 21a of the substrate 21, the second long side 22b of the memory 22 is shorter than the second long side 21b of the substrate 21, the first short side 22c of the memory 22 is shorter than the first short side 21c of the substrate 21, and the second short side 22d of the memory 22 is shorter than the second short side 21d of the substrate 21. When the memory 22 is disposed on the substrate 21, the first long side 22a of the memory 22 is parallel to the first long side 21a of the substrate 21 by a distance, the second long side 22b of the memory 22 is parallel to the second long side 21b of the substrate 21 by a distance, the first short side 22c of the memory 22 is parallel to the first short side 21c of the substrate 21 by a distance, and the second short side 22d of the memory 22 is parallel to the second short side 21d of the substrate 21 by a distance. The connection port 23 is located in a space between the second short side 22d of the memory 22 and the second short side 21d of the substrate 21.

Referring to FIG. 2 and FIG. 3 as well as FIG. 4 and FIG. 5, the second heat dissipating member 50 has a first long side 50a and a second long side 50b, and a first short side 50c and a second short side 50d that are opposite to each other. The first short side 50c and the second short side 50d are respectively connected between two ends of the first long side 50a and the second long side 50b. When the second heat dissipating member 50 is adhered between the memory 22 of the heat source module 20 and the upper cover 30, the first long side 50a of the second heat dissipating member 50 overlaps the first long side 22a of the memory 22, the second long side 50b of the second heat dissipating member 50 overlaps the second long side 22b of the memory 22, the second short side 50d of the second heat dissipating member 50 overlaps the second short side 22d of the memory 22, and the first short side 50c of the second heat dissipating member 50 is parallel to the first short side 22c of the memory 22 by a distance. That is to say, the length of the second heat dissipating member 50 is slightly less than the length of the memory 22, such that a space between the first short side 50c of the second heat dissipating member 50 and the first short side 22c of the memory 22 allows a screw fastening member for fastening the substrate 21 and the base 10 to pass through.

With the configuration of the second heat dissipating member 50 and the memory 22, the second heat dissipating member 50 is allowed to come into contact with the memory 22 by a maximum area, so as to quickly transmit the heat energy generated on the memory 22 to the upper cover 30 and conduct the heat energy to an exterior, enhancing heat conduction and heat dissipation effects.

Figure 6:
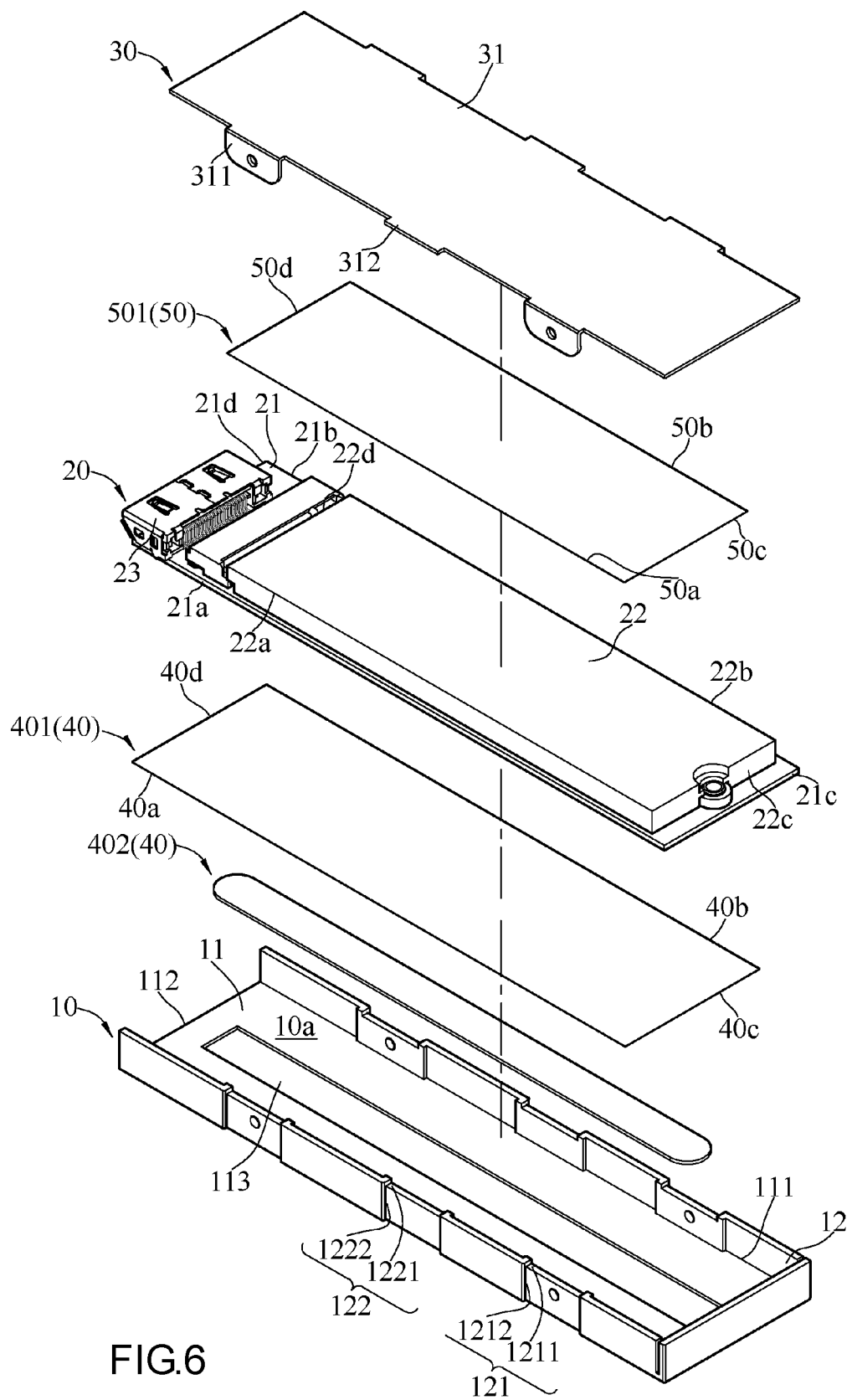
FIG. 6 is an exploded perspective structural diagram of a pluggable electronic device according to a further embodiment of the present invention.
Figure 7:
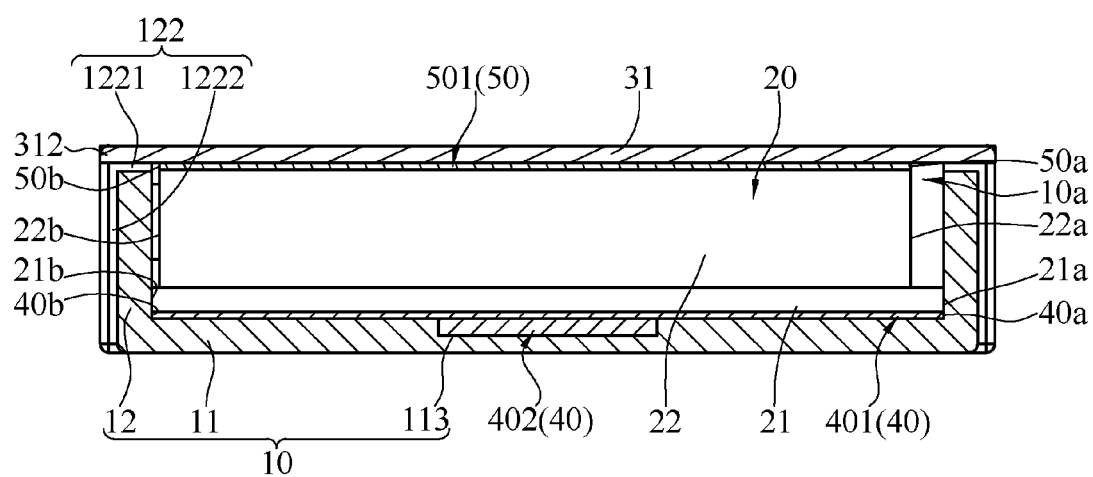
FIG. 7 is a section view of the embodiment in FIG. 6.

In one embodiment, referring to FIG. 6 and FIG. 7, the heat conductive plate 401 and the hot tube 402 may be simultaneously disposed between the base 10 and the heat source module 20. The hot tube 402 is adhered to the base 10, and the heat conductive plate 401 is adhered simultaneously to the hot tube 402, the base 10 and the heat source module 20. The second heat dissipating member 50 is also provided between the heat source module 20 and the upper cover 30. Thus, heat between the base 10 and the heat source module 20 can be thoroughly dissipated simultaneously through the heat conductive plate 401 and the hot tube 402, and heat between the heat source module 20 and the upper cover 30 can be thoroughly dissipated through the second heat dissipating member 50, providing even more ideal heat dissipation effects.

Referring to FIG. 2 or FIG. 3, further, in one embodiment, the upper cover 30 includes a covering surface portion 31, and covers the memory 22 of the heat source module 20 by using the covering surface portion 31. The covering surface portion 31 substantially overlaps the enclosed cavity, and the heat source module 20 may correspond to the position of the enclosed cavity of the upper cover 30, so as to achieve preferred heat conduction and heat dissipation effects. An area of the covering surface portion 31 covering the heat source module 20 is preferably capable of completely covering the memory 22.

Further, when the heat source module 20 has a different relationship with the accommodating space 10a, e.g., when the height of the heat source module 20 is lower than the height of the side surface portion 12 of the base 10, the covering surface portion 31 may be accommodated in the accommodating space 10a and be adhered to the heat source module 20. When the height of the heat source module 20 is coplanar with the side surface portion 12 of the base 10, the covering surface portion 31 may also be adhered simultaneously to a free end of the side surface portion 12 and the heat source module 20. As shown in FIG. 1, when the covering surface portion 31 of the upper cover 30 is accommodated in the accommodating space 10a of the base 10, the outer contour of the covering surface portion 31 of the upper cover 30 can completely locate within a contour surrounded by the side surface portion 12 of the base 10. Thus, the contour of an outer periphery of the upper cover 30 is limited within the side surface portion 12 of the base 10, thus stably limiting and positioning the upper cover 30.

Further, referring to FIG. 2 and FIG. 5, in one embodiment, an edge of the covering surface portion 31 of the upper cover 30 further includes a bent lug portion 311. An included angle is present between the bent lug portion 311 and the covering surface portion 31. Thus, when the covering surface portion 311 of the upper cover 30 covers the heat source module 20, the bent lug portion 311 can cover the side surface portion 12 of the base 10. The overlapping bent lug portion 311 and side surface portion 12 can be mutually combined by using a screw fastening member or a combining structure disposed between the two. In this embodiment, the covering surface portion 31 may be in a form that directly covers the free end of the side surface portion 12 and the heat source module 20. In another embodiment, when the covering surface portion 31 is accommodated in the accommodating space 10a, the side surface portion 12 of the base 10 includes a combining recess 121. As such, the bent lug portion 311 of the upper cover 30 can extend out via the combining recess 121 so as to combine with the side surface portion 12.

Further, referring to FIG. 2 and FIG. 5, in one embodiment, the combining recess 121 extends along an L-shape. In this embodiment, the combining recess 121 includes a first section 1211 and a second section 1212. The first section 1211 extends from one side of the side surface portion 12 facing the accommodating space 10a towards the other side to be out of the accommodating space 10a. The second section 1212 extends from the free end of the side surface portion 12 to one end of the side surface portion 12 connected to the lower surface portion 11. Thus, when the covering surface portion 31 is accommodated in the accommodating space 10a, the bent lug portion 311 extends from the first section 1211 to be out of the accommodating space 10a, and the bent lug portion 311 extending out of the accommodating space 10a can then further be accommodated in the second section 1212. As such, when the upper cover 30 is combined at the base 10, the upper cover 30 does not protrude from the base 10, preventing possible impacts and damages caused by a partial protruding part in addition to providing an esthetic value.

Referring to FIG. 2 or FIG. 4, in one embodiment, an edge of the covering surface portion 31 of the upper cover 30 further includes a leveled lug portion 312, which protrudes from the side surface portion 12 along a direction parallel to the lower surface portion 11. The leveled lug portion 312 is coplanar with the covering surface portion 31. Thus, the leveled lug portion 312 protrudes from the side surface portion 12 so as to provide a user with a part for applying a force for holding while the upper cover 30 is being assembled or disassembled, further facilitating operations.

Referring to FIG. 2 and FIG. 4, in one embodiment, the side surface portion 12 of the base 10 includes an operation recess 122, through which the leveled lug portion 312 of the upper cover 30 can extend out to be held by a user. More specifically, in one embodiment, the operation recess 122 extends along an L-shape. In this embodiment, the operation recess 122 includes a first recessed section 1221 and a second recessed section 1222. The first recessed section 1221 extends from one side of the side surface portion 12 facing the accommodating space 10a towards the other side to be out of the accommodating space 10a. The second recessed section 1222 extends from the free end of the side surface portion 12 to one end of the side surface portion 12 connected to the lower surface portion 11. Thus, when the covering surface portion 31 is accommodated in the accommodating space 10a, the leveled lug portion 312 extends from the first recessed section 1221 to be out of the accommodating space 10a and extends into the second recessed section 1222, and the free end of the leveled lug portion 312 is coplanar with the other side of the side surface portion 12. As such, when the upper cover 30 is combined at the base 10, the leveled lug portion 312 extends out from the first recessed portion 1221, and the second recessed section 1222 provides a user with a space for holding the leveled lug portion 312. Meanwhile, the leveled lug portion 312 is substantially aligned with the side surface portion 12, accordingly providing an esthetic value as well as operation convenience.

In one embodiment, the upper cover 30 may simultaneously include the bent lug portion 311 and the leveled lug portion 312, and the side surface portion 12 of the base 10 may simultaneously include the combining recess 121 and the operation recess 122. In this embodiment, the leveled lug portion 312 and the bent lug portion 311 are provided at an interval, and the combining recess 121 and the operation recess 122 are also provided at an interval, accordingly providing both combining stability and operation convenience.

While the invention has been disclosed by way of the embodiments described above, it is to be understood that the invention is not limited thereto. Changes or modifications may be made to the invention by the skilled person in the related art without departing from the spirit and scope of the invention. The scope of the patent protection therefore should be defined by the appended claims.

What is claimed is:

1. A pluggable electronic device, comprising:
    a base, made of a metal material, and comprising a channel;
    a hot tube disposed in the channel;
    a first heat dissipating plate disposed covering the hot tube;
    a heat source module, disposed above the first heat dissipating plate;
    a second heat dissipating plate disposed covering the heat source module; and
    an upper cover, covering the heat source module and connected to the base, the upper cover comprising a first surface and a second surface opposite to the first surface, the first surface and the second surface connected by a lateral edge to form an enclosed cavity between the first and second surfaces, and an operating fluid cyclically performing evaporation and condensation in the enclosed cavity, wherein the first and second surfaces are substantially planar;
    wherein the base comprises a side surface portion, the side surface portion defines an accommodating space, and the hot tube, first heat dissipating plate, heat source module, and second heat dissipating plate are accommodated in the accommodating space; and
    wherein the upper cover further comprises, as part a unitary structure, a bent lug portion that is combinable with the side surface portion, and a leveled lug portion protruding from the lateral edge along a plane of the first surface such that it protrudes past the side surface portion.

2. The pluggable electronic device according to claim 1, wherein the base comprises a lower surface portion, and the side surface portion is located at a periphery of the lower surface portion to define the accommodating space.

3. The pluggable electronic device according to claim 1, wherein the upper cover is made of copper and comprises a covering surface portion that substantially overlaps the enclosed cavity and covers the heat source module.

4. The pluggable electronic device according to claim 3, wherein the side surface portion further comprises a combining recess, the bent lug portion is disposed at the lateral edge of the upper cove, an included angle is formed between a periphery of the bent lug portion located at the covering surface portion and the covering surface portion, and the bent lug portion protrudes from the accommodating space and is accommodated in the combining recess so as to combine the bent lug portion with the side surface portion.

5. The pluggable electronic device according to claim 1, wherein the first and second surfaces and the enclosed cavity are part of the unitary structure.

6. The pluggable electronic device according to claim 1, wherein the side surface portion further comprises an operation recess, the operation recess extends along an L-shape and includes a first recessed section and a second recessed section, the leveled lug portion extends from the first recessed section to be out of the accommodating space and extends into the second recessed section, such that a lower surface of the leveled lug portion is exposed.

7. A heat dissipating housing, for accommodating a heat source module, comprising:
    a base, made of a metal material and comprising a channel;
    a hot tube disposed in the channel;
    a first heat dissipating plate disposed covering the hot tube;
    a second heat dissipating plate disposed above the first heat dissipating plate, wherein the first and second heat dissipating plates are arranged to receive the heat source module therebetween; and
    an upper cover, covering the heat source module and connected to the base, the upper cover comprising a first surface and a second surface opposite to the first surface, the first surface and the second surface connected by a lateral edge to form an enclosed cavity between the first and second surfaces, and an operating fluid cyclically performing evaporation and condensation in the enclosed cavity, wherein the first and second surfaces are substantially planar;
    wherein the base comprises a side surface portion, the side surface portion defines an accommodating space, and the hot tube, first heat dissipating plate, heat source module, and second heat dissipating plate are accommodated in the accommodating space; and
    wherein the upper cover further comprises, as part a unitary structure, a bent lug portion that is combinable with the side surface portion, and a leveled lug portion protruding from the lateral edge along a plane of the first surface such that it protrudes to the side surface portion.

8. The heat dissipating housing according to claim 7, wherein the base comprises a lower surface portion, and the side surface portion is located at a periphery of the lower surface portion to further define the accommodating space.

9. The heat dissipating housing according to claim 7, wherein the upper cover is made of copper and comprises a covering surface portion that substantially overlaps the enclosed cavity and is accommodated in the accommodating space and covers the heat source module.

10. The heat dissipating housing according to claim 9, wherein the side surface portion further comprises a combining recess, the bent lug portion at the lateral edge of the upper cover, an included angle is formed between a periphery of the bent lug portion located at the covering surface portion and the covering surface portion, and the bent lug portion protrudes from the accommodating space and is accommodated in the combining recess so as to combine the bent lug portion with the side surface portion.

11. The heat dissipating housing according to claim 9, wherein the covering surface portion substantially overlaps the enclosed cavity and is accommodated in the accommodating space and covers the heat source module.

12. The heat dissipating housing according to claim 7, wherein the first and second surfaces and the enclosed cavity are part of the unitary structure.

13. The heat dissipating housing according to claim 7, wherein the side surface portion further comprises an operation recess, the operation recess extends along an L-shape and includes a first recessed section and a second recessed section, the leveled lug portion extends from the first recessed section to be out of the accommodating space and extends into the second recessed section, such that a lower surface of the leveled lug portion is exposed.

14. A heat dissipating housing, for accommodating a heat source, comprising:
    a base, made of a metal material, carrying the heat source; and
    an upper cover, made of copper, covering the heat source and connected to the base, the upper cover comprising a first surface and a second surface opposite to the first surface, the first surface and the second surface connected by a lateral edge to form an enclosed cavity between the first and second surfaces, and an operating fluid cyclically performing evaporation and condensation in the enclosed cavity, wherein the first and second surfaces are substantially planar;
    wherein the base comprises a side surface portion, the side surface portion defines an accommodating space, and the heat source module is accommodated in the accommodating space; and
    wherein the upper cover further comprises a bent lug portion that is combinable with the side surface portion, and a leveled lug portion protruding from the lateral edge along a plane of the first surface such that it protrudes past the side surface portion, wherein the bent lug, leveled lug, the first and second surfaces, the lateral edge, and the enclosed cavity are part of a unitary structure.

15. The heat dissipating housing according to claim 14, wherein the side surface portion further comprises an operation recess, the operation recess extends along an L-shape and includes a first recessed section and a second recessed section, the leveled lug portion extends from the first recessed section to be out of the accommodating space and extends into the second recessed section, such that a lower surface of the leveled lug portion is exposed.

\* \* \* \* \*